United States Patent [19]

Cottrell et al.

[11] Patent Number: 4,670,669

[45] Date of Patent: Jun. 2, 1987

[54] CHARGE PUMPING STRUCTURE FOR A SUBSTRATE BIAS GENERATOR

[75] Inventors: Peter E. Cottrell, Essex Junction; William J. Craig, South Burlington; Ronald R. Troutman, Essex Junction, all of Vt.

[73] Assignee: International Business Machines Corporation, Armonk, N.Y.

[21] Appl. No.: 640,421

[22] Filed: Aug. 13, 1984

[51] Int. Cl.⁴ .................. H01L 27/04; H01L 19/00; H03K 3/354
[52] U.S. Cl. .................. 307/297; 307/303; 357/48; 357/86
[58] Field of Search .............. 307/296 R, 297, 280, 307/300, 303; 357/23.6, 41, 42, 92, 48, 86

[56] References Cited

U.S. PATENT DOCUMENTS

| | | | |
|---|---|---|---|
| 3,794,862 | 2/1974 | Jenne | 307/304 |
| 3,878,551 | 4/1975 | Callahan, Jr. | 357/48 |
| 3,931,634 | 1/1976 | Knight | 357/48 |
| 4,001,869 | 1/1977 | Brown | 357/23.6 X |
| 4,027,325 | 7/1977 | Genesi | 357/86 |
| 4,115,794 | 9/1978 | De La Moneda | 357/23 |
| 4,117,507 | 9/1978 | Pacor | 357/48 |
| 4,163,245 | 7/1979 | Kinoshita | 357/51 |
| 4,211,941 | 7/1980 | Schade, Jr. | 357/23.6 X |
| 4,223,238 | 9/1980 | Parkinson et al. | 307/297 |
| 4,255,677 | 3/1981 | Boonstra et al. | 357/23.6 X |
| 4,255,756 | 3/1981 | Shimotori et al. | 357/51 |
| 4,336,466 | 6/1982 | Sud et al. | 307/297 |
| 4,377,756 | 3/1983 | Yoshihara et al. | 307/296 R |
| 4,378,506 | 3/1983 | Taira | 307/297 |
| 4,384,218 | 5/1983 | Shimotori et al. | 307/304 |
| 4,403,158 | 9/1983 | Slemmer | 307/297 |
| 4,430,581 | 2/1984 | Mogi et al. | 307/297 X |
| 4,439,692 | 3/1984 | Beekmans et al. | 307/297 |
| 4,450,515 | 5/1984 | Takemae et al. | 307/297 X |
| 4,458,158 | 7/1984 | Mayrand | 357/92 X |
| 4,471,290 | 9/1984 | Yamaguchi | 307/297 X |
| 4,491,746 | 1/1985 | Koike | 307/303 X |
| 4,535,530 | 8/1985 | Denda et al. | 357/23.6 X |
| 4,539,490 | 9/1985 | Ariizumi et al. | 357/23.6 X |
| 4,559,548 | 12/1985 | Iizuka et al. | 307/296 R X |

FOREIGN PATENT DOCUMENTS

| | | | |
|---|---|---|---|
| 0103460 | 8/1981 | Japan | 307/303 |
| 002064 | 7/1983 | Japan | 307/303 |

OTHER PUBLICATIONS

H. Frantz et al, "MOSFET Substrate Bias-Voltage Generator", *IBM Technical Disclosure Bulletin*, vol. 11, No. 10, Mar. 1969, p. 1219.

*Primary Examiner*—Stanley D. Miller
*Assistant Examiner*—David R. Bertelson
*Attorney, Agent, or Firm*—Mark F. Chadurjian; George Tacticos

[57] ABSTRACT

A charge pumping structure is disclosed for use in a substrate bias voltage generator. It includes a capacitor on a substrate region for coupling to a first node periodic voltage signals received at a second node. A first diode structure provides a current path from the first node to the substrate and a second diode structure provides a current path between the first node and a reference potential, which is typically the ground. The first diode structure includes a PN junction diode, an isolation ring for collecting minority charge carriers injected into the substrate and is constructed on a portion of the substrate that has a lower doping concentration than the underlying substrate portion establishing a built-in electric field which inhibits the flow of minority carriers from the first diode to the underlying substrate. The second diode structure may include a pocket type PN junction diode constructed so that majority carriers are prevented from moving back into the substrate from which the substrate bias voltage generator will have to remove them.

5 Claims, 7 Drawing Figures will be repelled by this electric field and be prevented from moving into the adjoining first conductivity portion with the relatively higher doping concentration. There are also means in this first substrate portion for collecting charge carriers injected into this first substrate portion by the first diode means. The first node is also coupled to a reference potential through a second diode means. In one embodiment of this invention, the first diode means is a first PN junction diode established in the first substrate portion by the formation of a PN junction forming a layer of a second conductivity type in a predetermined portion of the first conductivity type first substrate portion. The means for collecting minority charge carriers which are injected into the first substrate portion may include a well region of a second conductivity type around this first substrate portion. To improve the minority charge collection in the first substrate portion, a first FET diode structure may be constructed having the diode forming second conductivity region as a source region and a second conductivity well contact region as a drain region. A gate electrode is tied to the well contact region and to a first conductivity substrate contact region. Minority charge cariers injected into the first substrate portion from the diode forming second conductivity region tied to the first node will move toward the well region and be collected there. The presence of this FET diode structure will facilitate the movement of minority charge carriers from the first substrate portion toward the well contact region through a majority carrier device.

The charge drawn from the substrate during one portion of the oscillator cycle will have to be dissipated to a structure having a reference potential such as ground. This is done through the use of a second diode means connected between the first node and a reference potential structure which is usually the ground. This second diode means can be a second PN junction diode or a second FET diode formed in a second portion of said substrate. In one embodiment of this invention, the second diode means is a pocket-type PN junction diode adopted for use in a charge pumping structure. Such a diode structure can reduce or eliminate the injection into the substrate of the charge carriers which during the first part of the cycle were removed from the structure and temporarily stored in the capacitor for transfer into ground through this diode during the second part of the cycle.

Through the teachings of the present invention, charge pumping structures can be constructed with a good pumping efficiency and a minimum of undesirable charge injection into the substrate. While most discussion focuses around charge pumping structures constructed in P-type substrates for use with N-channel MOSFET circuit and the CMOS circuits built in P-type substrates, the same principles apply to the construction of charge pumping structures in either P or N type substrates.

DETAILED DESCRIPTION

Figure 1:
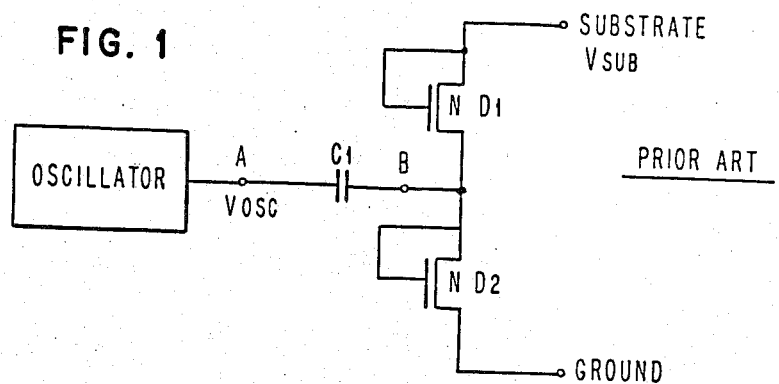
FIG. 1 illustrates a prior art substrate bias voltage generator schematic diagram including a prior art charge pumping circuit.
Figure 2A:
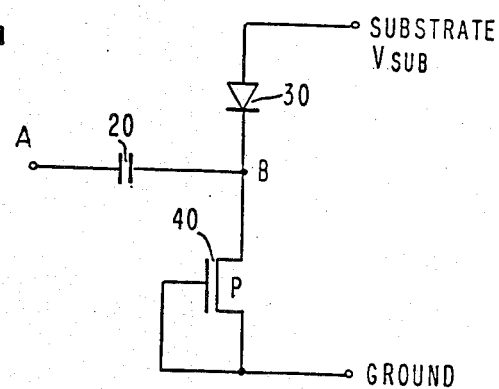
FIGS. 2a through 2c include a electrical schematic diagram and waveforms at two nodes shown in this diagram explaining the operation of a charge pumping circuit constructed in accordance with the teachings of the present invention.
Figure 2B:
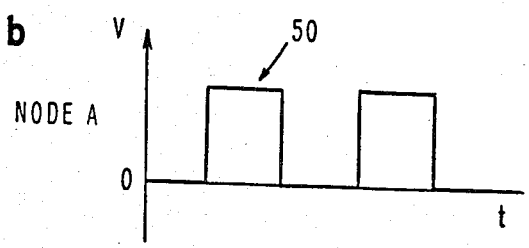
Figure 2C:
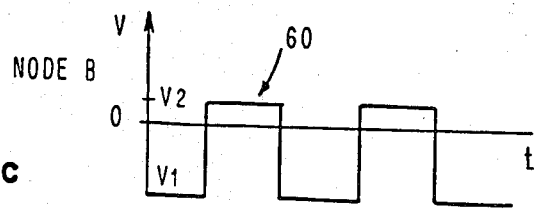
Figure 5:
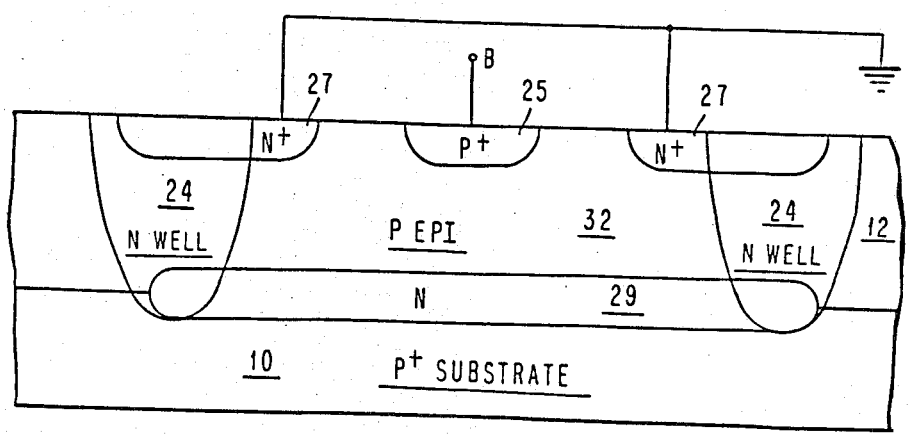
FIG. 5 illustrates in a diagrammatic cross-sectional view of pocket-type diode structure adopted for use in a charge pumping structure constructed in accordance with the teachings of the present invention.

Referring now to FIG. 1, there is shown a prior art electrical schematic diagram of a substrate bias generator. It includes an oscillator applying periodic voltage signals to a charge pumping circuit. The charge pumping circuit includes a capacitor C1, and two N-channel FET diodes D1 and D2 connecting one side of the capacitor to the substrate and the ground respectively. During each cycle of the oscillator voltage, a certain amount of charge is removed from the substrate and returned to ground. This charge per cycle is given by:

$$Q/\text{cycle} = C [V_{OSC} - V_{TH1} - V_{TH2} + V_{SUB}]$$

Where C is the capacitance of capacitor C1, $V_{OSC}$ is the output voltage of the oscillator, $V_{TH1}$ is the threshold voltage of FET diode D1, and $V_{TH2}$ is the threshold voltage of FET diode D2. The term threshold voltage refers to the amount of voltage that is required for the diode to turn-on. Thus, the lower the threshold voltage of the diodes selected, the more charge will be transferred out of the substrate during each oscillator voltage cycle. Several references discussing charge pumping structures for P type substrates show the use of N-channel FET diodes for the removal of charge carriers out of the substrate. When N-channel FET diodes are used for such applications, they provide certain advantages. They have a relatively low threshold voltage as compared to most conventional P-channel FET diodes, and they can be made during the same processing steps used to make all other N-channel devices on a P type substrate. However, they also have certain disadvantages. For example, N-channel FET diodes inject electrons into the P type substrates. When such a diode is forward biased (i.e., when the voltage at node B is less than that of the substrate) the injection of electrons into a P substrate can interfere with the operation of adjacent sensitive N-channel active devices. This is why we have invented a new and improved charge pumping sturcture such as that depicted in the embodiment shown in the schematic diagram of FIG. 2a. It includes a first diode means 30, such as that shown in FIG. 3, and a second diode means which could be a P-channel FET diode or a pocket-type PN junction diode as shown in FIG. 5. In FIG. 2a there is shown a capacitor 20 between first node B and second node A. A PN junction diode structure 30 connects the cathode of the diode to first node B and the anode to the substrate. A P-channel FET diode 40 connects first node B to ground. In FIG. 2b there is shown the waveform 50 of a voltage signal applied to node A with the voltage going from 0 to VDD, which typically is set to about 5 volts. This may be the output of an oscillator. In FIG. 2c there is shown the resulting voltage waveform 60 at node B. It is

CHARGE PUMPING STRUCTURE FOR A SUBSTRATE BIAS GENERATOR

FIELD OF THE INVENTION

The invention relates in general to substrate bias generator circuits and structures for producing an electric potential in a semiconductor substrate, and more particularly to charge pumping structures used in substrate bias generators.

RELATED APPLICATION

In a copending U.S. patent application Ser. No. 546,224, entitled "Substrate Voltage Generator", filed on Oct. 27, 1983 by J. S. Bialas, Jr. et al and assigned to the same assignee as the present application, now U.S. Pat. No. 4,591,738 there is disclosed and claimed an improved substrate bias generator having a pumping capacitor with a higher per unit area capacitance than available in conventional substrate bias generators and having a current FET device with a source diffusion which is also used as a guard ring around the charge pumping circuit.

In a co-pending U.S. patent application Ser. No. 632,098, filed on July 18, 1984 entitled "Twin Diode Overvoltage Protection Structure", by the inventors of the present application and assigned to the assignee of the present application, now U.S. Pat. No. 4,626,882 there is disclosed and claimed an improved overvoltage protection structure having two diodes of opposite polarity connected to signal source, the first diode being formed in a well region having a concentration gradient such that minority carriers are repelled away from the substrate, and the second diode injecting the minority carriers into an isolated pocket region.

BACKGROUND OF THE INVENTION

It is known that MOSFET integrated circuits perform better when their common substrate is maintained at a predetermined voltage level. This can be accomplished by connecting the substrate to an external bias source or alternatively by incorporating into the integrated circuit a substrate bias generating circuit which is capable of generating a bias on the substrate and for maintaining it within a preselected range. This latter approach to biasing the substrate of integrated circuits is preferable to the earlier use of external bias sources because it eliminates the need for additional outside power supplies and the need for additional electrical connections to the substrate. Thus, many such on-chip substrate bias generators have been proposed, such as for example, the one discussed in an article by H. Frantz et al entitled "MOSFET Substrate Bias-Voltage Generator", published in the IBM Technical Disclosure Bulletin, Vol. 11, No. 10, page 1219, in March, 1969. Other references discussing substrate bias generating circuits and structures include U.S. Pat. Nos. 3,794,862, 4,115,794, 4,336,466, 4,378,506, and 4,403,158, and the copending related U.S. patent application Ser. No. 546,224 referred to above.

A substrate bias generator typically uses an oscillator circuit to provide a waveform potential to a charge pumping circuit. A diagram illustrating a conventional prior art substrate bias generating circuit is shown in FIG. 1, which is described in some detail in a later section of the specification. The charge pumping circuit, as discussed herein, is defined to include a capacitor, a first diode means that is connected between a first capacitor node and the substrate and a second diode means that is connected between the same first capacitor node and a reference potential, such as the ground. During operation charge is pumped from the substrate through the first diode means to the first capacitor node in response to a negative transition of a periodic input signal coupled through the capacitor to this first node, and then from there the pumped charge passes through the second diode means to the reference potential in response to a positive going transition of a periodic input signal. The typical diode means used in such applications are PN junction diodes or FET type diodes. For example, for N-channel MOS devices or for CMOS devices constructed on a P-type substrate, the substrate bias generator is used to apply a negative bias voltage to the substrate. It is therefore necessary to cause hole current to be drawn out of the substrate so as to drive the potential of the substrate to a negative level. The charge pumping efficiency of a charge pumping structure depends on the capacitance of the charging capacitor, the output voltage level of the oscillator which is applied on the capacitor, the pre-existing voltage level on the substrate and the threshold voltage of the diodes in the charge pumping circuit. Thus, for a given capacitor, a given oscillator output voltage, and a given substrate voltage level, the threshold voltage of the diodes used in the circuit will to a large extent determine the charge pumping efficiency of the circuit. The lower the threshold voltage level of the diodes the higher the charge pumping efficiency of the circuit. Furthermore, it is also important that the diode structures be designed so that they do not inject into the substrate majority or minority carriers during any portion of the pumping cycle. Among the limitations of many currently known charge pumping structures is their injection of charges into the substrate. This is undesirable regardless of the types of charge carriers injected. For example, the injections of electrons into a P-type substrate can cause the malfunction of active devices constructed in the substrate. However, even the injection of holes, which are the majority carriers in a P-type substrate, is undesirable because they are the very carriers which the charge pumping structure is pumping out of the substrate. Thus the injection of majority carriers is counterproductive to the efficient operation of the circuit as will be further discussed during the discussion of the prior art structure shown in FIG. 1.

SUMMARY OF THE INVENTION

The general purpose of this invention is to provide a new and improved charge pumping structure having most, if not all, the advantages of similarly employed prior art structures while eliminating many of their limitations. To accomplish this purpose, we have provided a charge pumping structure having a capacitor formed on a first conductivity type substrate for coupling to a first node periodic voltage signals received at a second node. First diode means are provided in a first portion of the substrate for providing a current path from the first node to the substrate. This first portion is doped with a first type conductivity determining material having a doping concentration which is lower than the doping concentration of the first conductivity material in the adjoining first conductivity type substrate portions thereby establishing a built-in electric field in the substrate so that minority charge carriers in the first portion with the relatively lower doping concentration shown to go from a negative voltage $V_1$ to a positive voltage $V_2$. $V_2$ is basically the threshold voltage of P-channel FET diode 40, which may have a value of about 1 volt. $V_1$ will be equal to $-(V_{DD}-V_2-V_{T30})$ where $V_{T30}$ is the threshold voltage of diode structure 30, when no charge is being removed out of the substrate. $V_1$ will be less negative when charge is being removed from the substrate.

Figure 3:
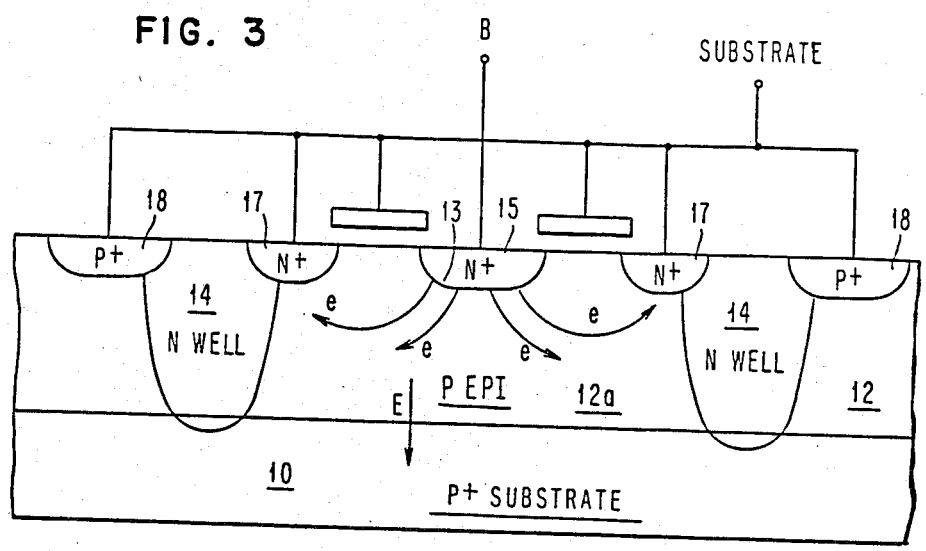
FIG. 3 illustrates in a diagrammatic cross-sectional view of a diode structure for use in a charge pumping structure constructed in accordance with the teachings of the present invention and as shown in electrical schematic diagram form in FIGS. 2a or 4.

Referring now to FIG. 3, there is shown a diode structure which includes a PN junction diode 13, for low threshold voltage, and means for preventing the minority carriers, which in this example are electrons, from reaching into adjacent active device regions and cause their malfunction. It includes a P type layer 12, which can be an epitaxial layer, formed on a P+ substrate 10. The substrate 10 may have a P+ type doping concentration of about $10^{19}$ atoms/cm$^3$ while the P region 12 should have a lower doping concentration which may be in the range of $10^{14}$ to $10^{17}$ atoms/cm$^3$. The difference in the doping concentration of layer 12 and substrate 10 causes the establishment of a built-in electric field (E) which will prevent or inhibit the movement of electrons from layer 12 to substrate 10. An N+ region 15 forms with a first P type portion 12a of layer 12 a first PN junction diode 13. The N+ region 15 is the cathode of the diode and is connected to node B. The anode 12 of this diode is connected to the substrate. During forward biasing, electrons (e) are injected into P type portion 12a. Some of these electrons recombine with holes (h) in the substrate. The remaining are deflected from going into the underlying P+ substrate by the built-in electric field (E). This electric field repulses the electrons. Thus, they have to move sidewise where they are collected by the N-well region 14, which is provided by the present invention. Region 14 is a well region formed as a ring region around diode 13. Region 17 represents a contact ring region for N-well region 14, and it also forms a drain region of a first FET diode formed by N+ region 15, which acts both as the N side of PN junction diode 13 and as a source of a first FET diode. Gate electrode 16 and drain contact region 17 are tied together. Electrons in the channel of this FET diode will move to N+ region 17. The structure is also surrounded by a P+ contact ring region 18 which, in addition to being a contact region for the epitaxial layer 12 and the underlying substrate, it is also used to interrupt any parasitic FET structures between the N-well region 14 and any other adjacent N+ region. Thus, PN junction diode 13 can be used in the position of PN junction 30 shown in FIG. 2a for the transfer of majority charge carriers out of the substrate without causing the injection of minority carriers into the substrate. This is accomplished by providing device 30 as shown in FIG. 3 with the structures adjacent PN junction diode 13 for preventing the movement of such carriers into the main portions of the epitaxial layer and the substrate where active devices are located.

Figure 4:
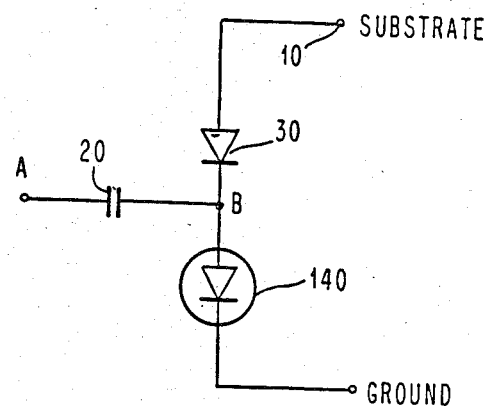
FIG. 4 is another electrical schematic diagram of a charge pumping structure constructed in accordance with the teachings of the present invention and including a diode structure as that illustrated in FIG. 3 and a diode structure as that illustrated in FIG. 5.

Referring now to FIG. 4, there is shown a schematic diagram of a charge pumping structure such as that shown in FIG. 2a, except the P-channel FET diode 40 of FIG. 2a is replaced in FIG. 4 by a special PN junction diode arrangement 140. An embodiment of a structure that can be used in 140 is illustrated in FIG. 5. In FIG. 5 there is shown on the same P+ type substrate 10, P type epitaxial layer 12 in which there is a PN junction diode forming a series of adjoining N-type regions consisting of N-well region 24 and buried layer 29 which, together, they define an isolated P type portion 32. N-type regions 24 and 29 and P-type isolated portion 32 form a second PN junction diode which is in the form of a pocket diode because of the way the N regions of this diode isolate the P-type region 32. An N+ ring contact region 27 is provided for connecting the N side of this diode to ground, and a P+ contact region 25 is provided for connecting of the P side of the diode to node B. During operation, when the diode structure 140 of FIG. 4 is as illustrated in FIG. 5, a hole current from node B will drain to ground without leaking holes into the substrate. The N regions which isolate the P region 32 collect the holes and prevent them from moving into the P epitaxial layer and through it into the underlying substrate. By eliminating the injection of holes into the substrate, the efficiency of the pumping structure is improved because it is holes that the pumping structure is designed to remove from P type substrates.

While the invention has been described in connection with preferred structures, it will be understood that is is not intended to limit the invention the structures described and shown in the drawings. On the contrary, it is intended to cover all alternatives, modifications, and equivalents, as may be included within the spirit and scope of the invention as defined by the appended claims.

What is claimed is:
1. A charge pumping structure comprising:
 a semiconductor substrate having a first type of conductivity;
 a capacitor formed on said substrate for coupling to a first node periodic voltage signals received at a second node;
 an epitaxial layer of said first conductivity type formed on said substrate wherein said epitaxial layer has a first conductivity doping concentration which is lower than the first conductivity doping concentration of the adjoining substrate portion thereby establishing a built-in electric field at the interface between said epitaxial layer and said substrate;
 a first diode forming region of a second conductivity type formed in a first portion of said epitaxial layer forming a first PN junction diode therewith, wherein said first diode forming region is comprised of a first ohmic contact region connected to said first node;
 a first well region of said second conductivity type formed in said epitaxial layer around said first PN junction diode and extending into a predetermined portion of said substrate below said first diode forming region;
 a second ohmic contact region of said second conductivity type coupled to said first well region;
 a third ohmic contact region of said first conductivity type located outside said portion of said epitaxial layer surrounded by first well region, said third ohmic contact region being coupled to said epitaxial layer;
 means for interconnecting said second and third ohmic contact regions;
 a second diode forming region of said second conductivity type formed in a second predetermined portion of said epitaxial layer, said second diode forming region defining an isolated first conductivity region in said epitaxial layer which is isolated from remaining portions of said epitaxial layer and from said substrate by said second diode forming region, said second diode forming region comprising a second well region of said second conductivity type circumferentially disposed about said isolated region and a buried region of said second conductivity type disposed below said isolated region and coupled to said second well region, wherein said isolated region forms a second PN junction diode with said second diode forming region;

first means connecting said isolated region to said first node; and second means connecting said second diode forming region to a reference potential.

2. A charge pumping structure as set forth in claim 1 wherein said reference potential is the ground potential.

3. A charge pumping structure as set forth in claim 2 wherein said second diode forming region includes a second conductivity well region and a second conductivity buried region joined together to isolate a predetermined portion of said first conductivity epitaxial layer from the remaining portion of said epitaxial layer.

4. A charge pumping structure as set forth in claim 3 wherein said second conductivity buried region is disposed at a portion of the interface between said epitaxial layer and said substrate.

5. A charge pumping circuit for providing a bias voltage to a semiconductor substrate of a first conductivity type, comprising:

a capacitor for coupling oscillating signals from a second node to a first node;

a first PN junction diode for coupling said first node to the substrate during a negative transition in said oscillating signal, comprising a first diode forming region of a second conductivity type formed in a first portion of said substrate having a concentration of first conductivity type dopants that is less than the concentration of first conductivity type dopants in remaining portions of said substrate, said respective concentrations of first conductivity type dopants in said first portion of said substrate and said remaining portions of said substrate providing an electric field opposing minority carrier injection into the substrate;

a first well region of said second conductivity type formed circumferentially about said first diode forming region, said first well region extending through said first portion of said substrate to said remaining portions of said substrate;

a first ohmic contact means of said second conductivity type formed contiguous to said first well region;

a second ohmic contact means of said first conductivity type coupled to said substrate;

means for electrically interconnecting said first ohmic contact means and said second ohmic contact means;

a first FET diode comprising a control electrode formed above a region of said substrate between said first diode forming region and said first ohmic contact means and being insulated therefrom, a first electrode comprised of said first diode forming region, and a second electrode comprised of said first ohmic contact means, said control electrode being coupled to one of said first and second electrodes;

a second PN junction diode for coupling said first node to a reference potential during a positive transition in said oscillating signal, said second PN junction diode comprising a third ohmic contact means of said first conductivity type formed in an isolated region within said first portion of said substrate that is isolated from remaining portions of said substrate, and a plurality of contiguous regions of said second conductivity type that are coupled to said reference potential, said contiguous regions surrounding and isolating said isolated region;

wherein, during a negative transition in said oscillating signal, minority charge carriers provided from said first diode forming region are repelled by said electric field and are collected by said first well region and said first ohmic contact means, and wherein, during a positive transition in said oscillating signal, majority charge carriers provided from said third ohmic contact means are collected by said plurality of contiguous regions coupled to said reference potential.

* * * * *